(12) United States Patent
Kajitani et al.

(10) Patent No.: US 10,529,841 B2
(45) Date of Patent: Jan. 7, 2020

(54) FIELD EFFECT TRANSISTOR

(71) Applicant: Panasonic Corporation, Osaka (JP)

(72) Inventors: Ryo Kajitani, Osaka (JP); Kenichiro Tanaka, Osaka (JP); Masahiro Ishida, Osaka (JP); Tetsuzo Ueda, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 15/219,244

(22) Filed: Jul. 25, 2016

(65) Prior Publication Data

US 2016/0336437 A1    Nov. 17, 2016

Related U.S. Application Data

(63) Continuation of application No. PCT/JP2015/000750, filed on Feb. 18, 2015.

(30) Foreign Application Priority Data

Feb. 21, 2014   (JP) ................. 2014-031346

(51) Int. Cl.
*H01L 29/66* (2006.01)
*H01L 29/778* (2006.01)
(Continued)

(52) U.S. Cl.
CPC ........ *H01L 29/7784* (2013.01); *H01L 29/205* (2013.01); *H01L 29/66462* (2013.01); *H01L 29/2003* (2013.01)

(58) Field of Classification Search
CPC .............................. H01L 29/778; H01L 29/66
See application file for complete search history.

(56) References Cited

U.S. PATENT DOCUMENTS

2005/0189561 A1*  9/2005  Kinzer ............... H01L 27/0605
                                                                 257/192
2006/0273347 A1  12/2006  Hikita et al.
(Continued)

FOREIGN PATENT DOCUMENTS

JP         2-049465         2/1990
JP      2004-241471         8/2004
(Continued)

OTHER PUBLICATIONS

International Search Report of PCT application No. PCT/JP2015/000750 dated Apr. 14, 2015.

*Primary Examiner* — Joseph C. Nicely
*Assistant Examiner* — Lamont B Koo
(74) *Attorney, Agent, or Firm* — McDermott Will & Emery LLP

(57) ABSTRACT

A field effect transistor having a reduced sheet resistance is provided. A channel layer, a first spacer layer, a second spacer layer, a first electronic barrier layer, and a second electronic barrier layer are sequentially grown on the main surface of a substrate. A gate recess is created, and then an ion implanted section is formed. A third electronic barrier layer and a p-type layer are formed by a metalorganic chemical vapor deposition (MOCVD) method. The p-type layer except a portion at the gate recess is removed. B ions are implanted in the regrown third electronic barrier layer to reform the ion implanted section. A source electrode and a drain electrode are formed on the third electronic barrier layer. Then a gate electrode is formed on the p-type layer.

12 Claims, 14 Drawing Sheets

(51) Int. Cl.
*H01L 29/205* (2006.01)
*H01L 29/20* (2006.01)

(56) References Cited

U.S. PATENT DOCUMENTS

| | | | | |
|---|---|---|---|---|
| 2007/0278521 A1* | 12/2007 | Ishida | .................. | H01L 29/0891 257/192 |
| 2008/0149940 A1* | 6/2008 | Shibata | .................... | H01L 24/05 257/76 |
| 2009/0146182 A1* | 6/2009 | Hikita | .................. | H01L 29/2003 257/190 |
| 2011/0227132 A1* | 9/2011 | Anda | ................. | H01L 29/42316 257/192 |
| 2012/0153355 A1* | 6/2012 | Umeda | ............... | H01L 29/2003 257/192 |
| 2013/0181255 A1* | 7/2013 | Kiyama | ............ | H01L 29/66462 257/190 |
| 2013/0341635 A1* | 12/2013 | Cao | ....................... | H01L 29/432 257/76 |
| 2014/0097468 A1* | 4/2014 | Okita | ................ | H01L 29/42316 257/192 |

FOREIGN PATENT DOCUMENTS

| | | |
|---|---|---|
| JP | 2006-339561 | 12/2006 |
| JP | 2007-158143 | 6/2007 |
| JP | 2010-040828 | 2/2010 |
| JP | 2012-070010 | 4/2012 |
| JP | 2013-125918 | 6/2013 |
| JP | 2014-056998 | 3/2014 |
| WO | 2013/008422 | 1/2013 |

\* cited by examiner

FIELD EFFECT TRANSISTOR

BACKGROUND

1. Technical Field

The present disclosure relates to a semiconductor element used under a high current and a high voltage.

2. Description of the Related Art

A group-III nitride semiconductor is a useful material for a heterostructure field effect transistor (HFET) used under a high current and a high voltage, since the group-III nitride semiconductor has a larger bandgap and a breakdown field than a conventional semiconductor, such as a silicon (Si) semiconductor.

In the group-III nitride HFET, the two dimensional electron gas (2DEG) generated at a heterojunction interface between, for example, an aluminum gallium nitride ($Al_xGa_{1-x}N$ ($0 \leq x \leq 1$)) electronic barrier layer and a gallium nitride (GaN) channel layer is used as a channel. To provide a normally-off property to the group-III nitride HFET, a recess is created in the electronic barrier layer to reduce a charge caused by piezoelectric polarization at the heterojunction interface, and a p-type layer, such as a p-GaN layer, is formed at the recess (PTL 1).

Meanwhile, an HFET with a higher carrier density is expected to be used under a further higher current. For example, the carrier density can be increased by increasing spontaneous polarization of the electronic barrier layer. Indium aluminum gallium nitride ($In_xAl_yGa_{1-x-y}N$ ($0 \leq x \leq 1$, $0 \leq y \leq 1$, $0 \leq x+y \leq 1$)) that can be lattice-matched with GaN and can achieve larger spontaneous polarization than AlGaN by adjusting the composition is expected to be used for an electronic barrier layer of the group-III nitride HFET (PTL 2).

Hereinafter, $In_xGa_{1-x}N$ ($0<x<1$), $Al_yGa_{1-y}N$ ($0<y<1$), and $In_zAl_{1-z}N$ ($0<z<1$), which are all ternary mixed crystals, are respectively abbreviated as AlGaN, AlGaN, and InAlN unless the composition is specified. The $In_xAl_yGa_{1-x-y}N$ ($0<x<1$, $0<y<1$, $0<x+y<1$), which is a quaternary mixed crystal, is abbreviated as InAlGaN.

CITATION LIST

Patent Literatures

PTL 1: Unexamined Japanese Patent Publication No. 2006-339561

PTL 2: Unexamined Japanese Patent Publication No. 2007-158143

SUMMARY

The structure in which a p-type nitride semiconductor layer is provided at a recess created in the $In_xAl_yGa_{1-x-y}N$ electronic barrier layer however is disadvantageously difficult to provide a normally-off property even when the electronic barrier layer at the recess has as small a thickness as 2 nm to 3 nm. This is because the recess almost does not contribute to reducing the charge caused by piezoelectric polarization at the heterojunction interface, since large spontaneous polarization occurs in the $In_xAl_yGa_{1-x-y}N$ electronic barrier layer and the $In_xAl_yGa_{1-x-y}N$ electronic barrier layer is lattice-matched with GaN. In addition, it has been found that the crystalline property of the $In_xAl_yGa_{1-x-y}N$ electronic barrier layer deteriorates during growing of the crystalline of the p-type layer, and thus the sheet resistance increases. The increase in the sheet resistance is caused by poor tolerance of the $In_xAl_yGa_{1-x-y}N$ electronic barrier layer under a temperature under which a crystal of the p-type layer grows. The temperature under which the $In_xAl_yGa_{1-x-y}N$ electronic barrier layer grows is approximately 900° C., whereas the temperature under which the crystal of the p-type nitride semiconductor layer grows is approximately 1100° C. During regrow of the p-type nitride semiconductor layer, a large amount of nitride escapes from the surface of the $In_xAl_yGa_{1-x-y}N$ electronic barrier layer, and thus the sheet resistance increases. To solve the above problem, the present disclosure is directed to provide a field effect transistor that operates under a high current and has a normally-off property. Definitely To solve the above problem, the field effect transistor according to the present disclosure includes a substrate, a first nitride semiconductor layer, a second nitride semiconductor layer, a third nitride semiconductor layer, a fourth nitride semiconductor layer, a first recess, a fifth nitride semiconductor layer, a source electrode, a drain electrode, and a gate electrode. The first nitride semiconductor layer is disposed on the substrate and includes a channel region. The second nitride semiconductor layer is disposed on the first nitride semiconductor layer and has a bandgap larger than a bandgap of the first nitride semiconductor layer. The third nitride semiconductor layer is disposed on the second nitride semiconductor layer and has a bandgap smaller than the bandgap of the second nitride semiconductor layer. The fourth nitride semiconductor layer is disposed on the third nitride semiconductor layer and includes In. The first recess penetrates at least the fourth nitride semiconductor layer. The fifth nitride semiconductor layer is a p-type nitride semiconductor layer and is provided at the first recess. The source electrode and the drain electrode are disposed on the fourth nitride semiconductor layer. The gate electrode is disposed on the fifth nitride semiconductor layer and between the source electrode and the drain electrode.

With this configuration, a field effect transistor that has a preferable threshold determined by the third nitride semiconductor layer can be provided.

More preferably, the field effect transistor according to the present disclosure includes a sixth nitride semiconductor layer that is disposed on the fourth nitride semiconductor layer and has a bandgap smaller than a bandgap of the fourth nitride semiconductor layer with the recess penetrating the sixth nitride semiconductor layer. In this preferable configuration, the recess penetrating the sixth nitride semiconductor layer enables the threshold to be controlled precisely.

More preferably, the field effect transistor according to the present disclosure includes a seventh nitride semiconductor layer that is disposed on the sixth nitride semiconductor layer to cover a side faces and a bottom face of the recess and has a bandgap larger than the sixth bandgap.

More preferably, in the field the effect transistor according to the present disclosure, the recess penetrates the second nitride semiconductor layer and the third nitride semiconductor layer, and a bottom face of the seventh nitride semiconductor layer is in contact with the first nitride semiconductor layer. In this preferable configuration, the recess penetrates the layers as far as to reach the first nitride semiconductor layer and the seventh nitride semiconductor layer is formed on the recess, so that the threshold can precisely be controlled independent of the depth of the recess.

More preferably, the field effect transistor according to the present disclosure includes an element isolating section which is formed by implantation of an impurity in at least a portion of the first nitride semiconductor layer.

More preferably, the field effect transistor according to the present disclosure further includes a second recess that surrounds in a plan view the gate electrode, the source electrode, and the drain electrode with the element isolating section provided in the second recess. In this preferable configuration, the impurity is not directly implanted in the channel region, so that a stable element isolating property and low current leakage can be achieved independent of the impurity implantation profile.

More preferably, in the field effect transistor according to the present disclosure, the fifth nitride semiconductor layer surrounds in a plane view the source electrode. In this preferable configuration, the acceptor included in the fifth nitride semiconductor layer forms a depletion layer to reduce current leakage between the gate and the source.

More preferably, in the field effect transistor according to the present disclosure, the bandgap of the second nitride semiconductor layer is larger than the bandgap of the third nitride semiconductor layer.

More preferably, in the field effect transistor according to the present disclosure, the bandgap of the second nitride semiconductor layer is larger than the bandgap of the fourth nitride semiconductor layer.

According to the present disclosure, a field effect transistor that operates under a high current and has a normally-off property and low current leakage can be provided.

DETAILED DESCRIPTION

Exemplary Embodiments

Figure 1:
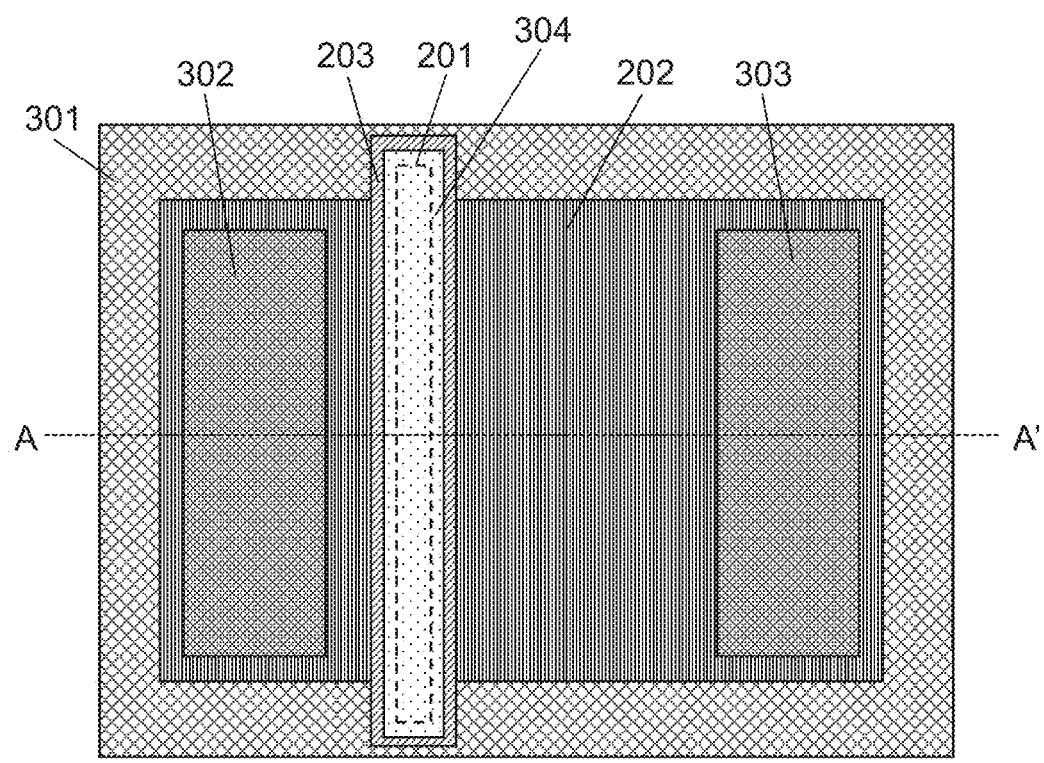
FIG. 1 is a top view of a field effect transistor according to a first exemplary embodiment.
Figure 2:
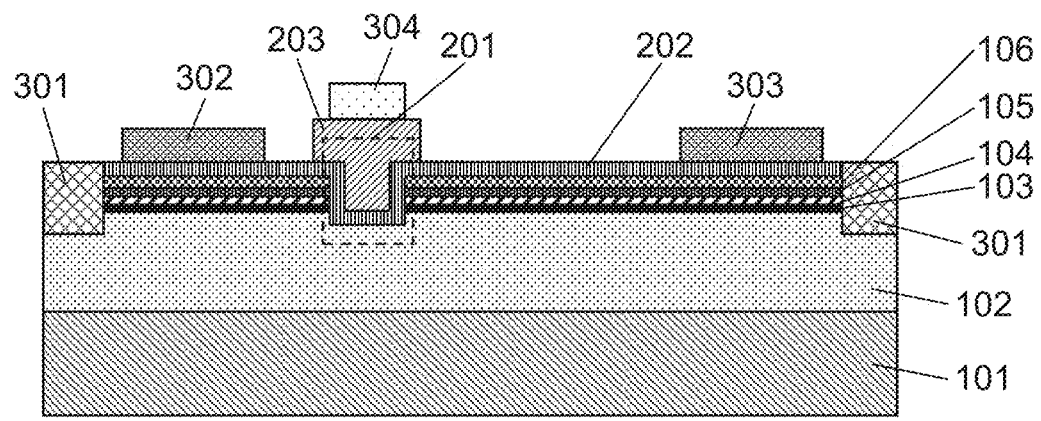
FIG. 2 is a sectional view of the field effect transistor according to the first exemplary embodiment.

Exemplary embodiments of the present disclosure will be described hereinafter with reference to the drawings.
First Exemplary Embodiment A nitride semiconductor element according to a first exemplary embodiment and a method for manufacturing the nitride semiconductor element will be described hereinafter. FIG. 1 is a top view of the field effect transistor according to the first exemplary embodiment, and FIG. 2 is a sectional view taken along line A-A' in FIG. 1. The method for manufacturing the field effect transistor will be described sequentially. Layers are grown in sequence by a metalorganic chemical vapor deposition (MOCVD) method on the main surface, which is a (111) plane, of substrate 101 made of Si. The layers are channel layer 102 made of, for example, GaN having a thickness of 2 μm and including a channel region, first spacer layer 103 made of, for example, AlN having a thickness of 1 nm, second spacer layer 104 made of for example, $Al_{0.30}Ga_{0.70}N$ having a thickness of 10 nm, first electronic barrier layer 105 made of for example, $In_{0.18}Al_{0.82}N$ having a thickness of 15 nm, and second electronic barrier layer 106 made of for example, GaN having a thickness of 3 nm. Then, gate recess 201 is created by dry etching after resist patterning. The bottom of gate recess 201 reaches channel layer 102. Then after resist patterning, ion implanted section 301 is formed by implanting, for example, B ions. Then, again by the MOCVD method, third electronic barrier layer 202 made of, for example, $Al_{0.30}Ga_{0.70}N$ having a thickness of 10 nm and p-type layer 203 made of p-$Al_{0.15}Ga_{0.85}N$ having a thickness of 50 nm and p-GaN having a thickness of 150 nm are regrown. Then, p-type layer 203 except the portion at gate recess 201 is removed by dry etching after resist patterning. Then, after resist patterning, ion implanted section 301 is formed again by implanting B ions, no that ions are implanted in regrown third electronic barrier layer 202 and 203. Then, source electrode 302 and drain electrode 303 each made of, for example, a Ti layer of 20 nm thickness and an Al layer of 200 nm thickness are formed on third electronic barrier layer 202. Then, gate electrode 304 made of a Ni layer having a thickness of 100 nm and an Au layer having a thickness of 500 nm is formed on p-type layer 203 so as p-type layer 203 to surround in a plan view source electrode. Further, p-type layer 203 is doped with Mg and has a p-type carrier concentration of $1\times10^{18}$ $cm^{-3}$.

The plane direction of the main surface of each of channel layer 102, first spacer layer 103, second spacer layer 104, first electronic barrier layer 105, second electronic barrier layer 106, third electronic barrier layer 202, and p-type layer 203, which are nitride semiconductor layers, is the (0001) plane (c plane).

Therefore, first spacer layer 103 has a larger bandgap than channel layer 102, and second spacer layer 104 has a smaller bandgap than first spacer layer 103. Second electronic barrier layer 106 has a smaller bandgap than first electronic barrier layer 105. Third electronic barrier layer 202 has a larger bandgap than second electronic barrier layer 106, and first spacer layer 103 has a larger bandgap than first electronic barrier layer 105.

The field effect transistor manufactured as described above has such a layer-structure as shown in TABLE 1.

TABLE 1

|  | Material | Layer thickness | Dopant |
|---|---|---|---|
| Substrate 101 | Si | 300 μm | n-type impurity |
| Channel layer 102 | GaN | 2 μm | Undoped |
| First spacer layer 103 | AlN | 1 nm | Undoped |
| Second spacer layer 104 | $Al_{0.30}Ga_{0.70}N$ | 10 nm | Undoped |
| First electronic barrier layer 105 | $In_{0.18}Al_{0.82}N$ | 15 nm | Undoped |
| Second electronic barrier layer 106 | GaN | 3 nm | Undoped |
| Third electronic barrier layer 202 | $Al_{0.30}Ga_{0.70}N$ | 10 nm | Undoped |
| p-type layer 203 | $Al_{0.15}Ga_{0.85}N$ | 50 nm | Mg |
|  | GaN | 150 nm | Mg |
| Source electrode 302 | Ti/Al | 20 nm/200 nm | — |
| Drain electrode 303 | Ti/Al | 20 nm/200 nm | — |
| Gate electrode 304 | Ni/Au | 100 nm/500 nm | — |

The longitudinal direction of gate electrode 304 of the field effect transistor according to the present disclosure is <11-20> direction. Source electrode 302 and gate electrode 304 are thus connected along <1-100> direction. The gate length (the width of gate electrode 304 in <1-100> direction) is 1.0 μm, the distance between the edges of source electrode 302 and gate electrode 304 opposing each other is 1.5 μm, and the distance between the edges of drain electrode 303 and gate electrode 304 opposing each other is 10.0 μm. The size of the field effect transistor is 250 μm in <11-20> direction and 250 μm in <1-100> direction. Ion implanted section 301 is provided in the region 20.0 μm from the edges of the field effect transistor.

In the field effect transistor according to the exemplary embodiment, gate recess 201 penetrates at least first electronic barrier layer 105 with the bottom of gate recess 201 reaching channel layer 102. Third electronic barrier layer 202 is in direct contact with channel layer 102 and covers the side faces and the bottom face of the recess. A two dimensional electron gas layer is formed at the interface between channel layer 102 and third electronic barrier layer 202. By applying a voltage to p-type layer 203, the depletion layer extends from p-type layer 203 toward third electronic barrier layer 202. The voltage necessary to deplete the two dimensional electron gas layer by the depletion layer (threshold voltage) depends on third electronic barrier layer 202. Therefore, the threshold voltage of the field effect transistor can be determined by the thickness of third electronic barrier layer 202.

Since the threshold voltage of the field effect transistor is determined by the thickness of regrown third electronic barrier layer 202, a field effect transistor having a preferable threshold property can be provided.

Therefore, a field effect transistor that operates under a high current and has a normally-off property and high threshold controllability can be provided.

Second Exemplary Embodiment

Figure 3:
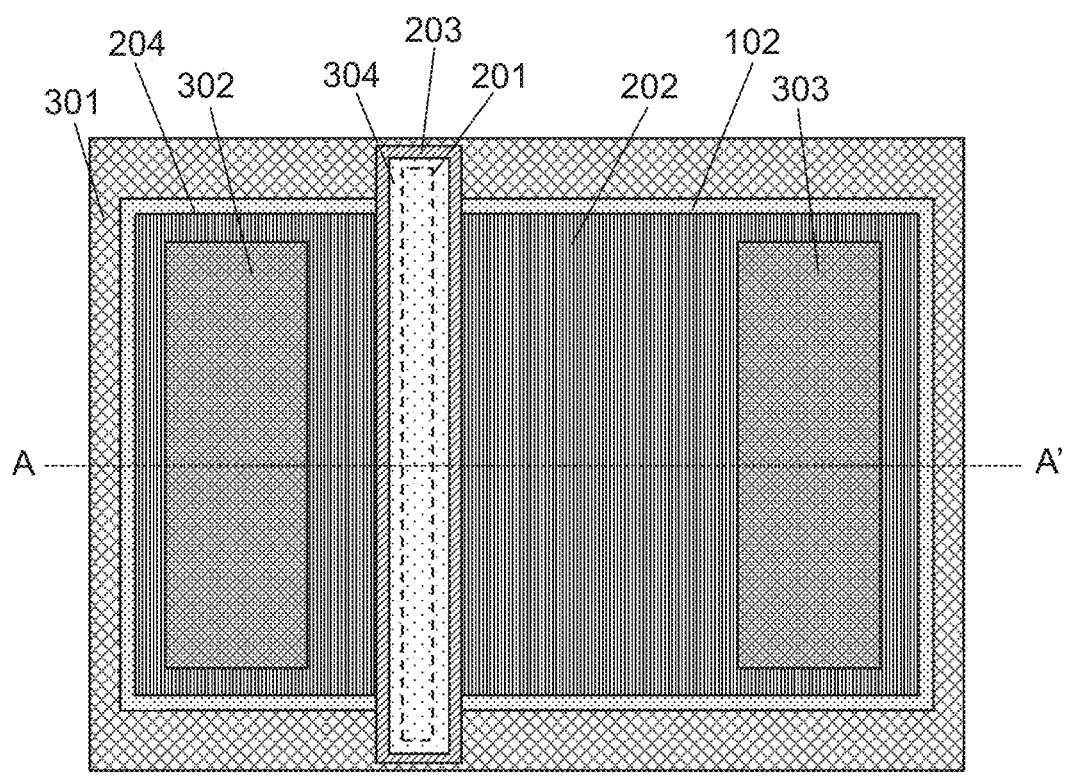
FIG. 3 is a top view of a field effect transistor according to a second exemplary embodiment.

A nitride semiconductor element according to a second exemplary embodiment and a method for manufacturing the nitride semiconductor element will now be described. FIG. 3 is a top view of the field effect transistor according to the second exemplary embodiment, and FIG. 4 is a sectional view taken along line A-A' in FIG. 3.

Figure 4:
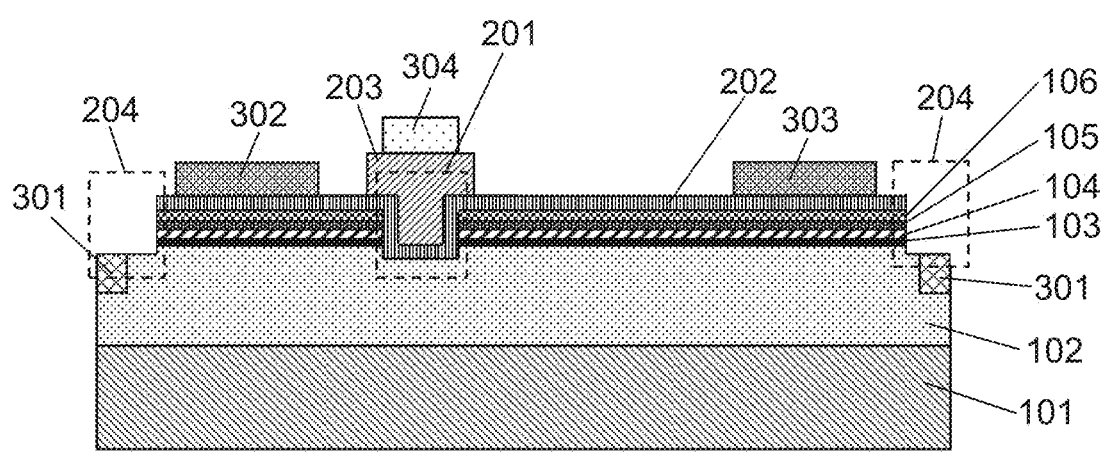
FIG. 4 is a sectional view of the field effect transistor according to the second exemplary embodiment.

In FIGS. 3 and 4, the same component as in FIGS. 1 and 2 is denoted by the same reference numeral and the description on the component is omitted. Channel layer 102, first spacer layer 103, second spacer layer 104, first electronic barrier layer 105, and second electronic barrier layer 106 are sequentially grown on the main surface of substrate 101 made of Si. Then, gate recess 201 is created by dry etching after resist patterning. Then, again by the MOCVD method, third electronic barrier layer 202 and p-type layer 203 are formed. Then, p-type layer 203 except the portion at gate recess 201 and the portion between the gate and the source is removed by dry etching after resist patterning. Then, a recess is created by dry etching after resist patterning to form element isolating section 204. Then, ion implanted section 301 is formed by ion implantation after resist patterning. Then, source electrode 302 and drain electrode 303 are formed on third electronic barrier layer 202. Then, gate electrode 304 is formed on p-type layer 203. Element isolating section 204 surrounds gate electrode, source electrode, and drain electrode. Similarly to the first exemplary embodiment, since the threshold of the device is determined by the thickness of regrown third electronic barrier layer 202, a field effect transistor having a preferable threshold property can be provided. In the first exemplary embodiment, ion implantation has to be performed two times because regrown third electronic barrier layer 202 needs to be implanted with ions. In the second exemplary embodiment, ion implantation is required only once because regrown third electronic barrier layer 202 has been removed by dry etching. Moreover, since ions are not implanted directly in the channel, a stable element, isolating property independent of the ion implantation profile is expected to be provided.

According to the second exemplary embodiment as described above, a field effect transistor that operates under a high current and has a normally-off property, a stable element isolating property, and high threshold controllability can be provided.

Third Exemplary Embodiment

Figure 5:
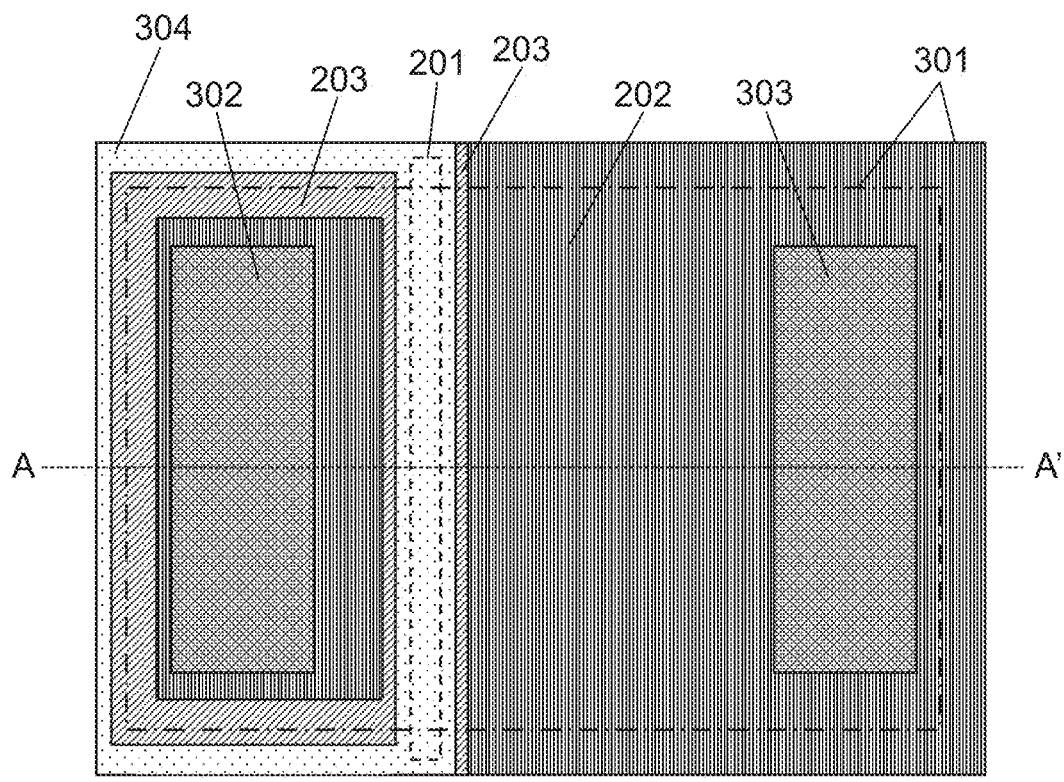
FIG. 5 is a top view of a field effect transistor according to a third exemplary embodiment.
Figure 6:
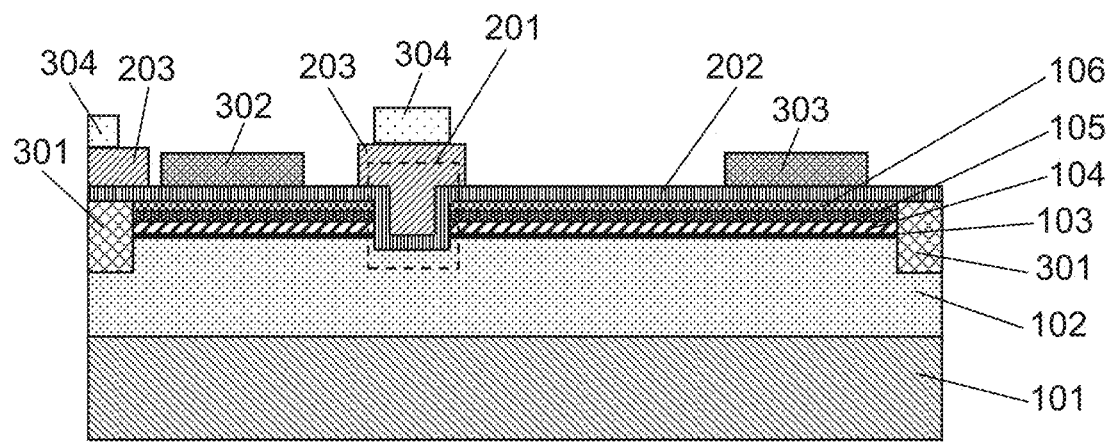
FIG. 6 is a sectional view of the field effect transistor according to the third exemplary embodiment.

A nitride semiconductor element according to a third exemplary embodiment and a method for manufacturing the nitride semiconductor element will now be described. FIG. 5 is a top view of the field effect transistor according to the third exemplary embodiment, and FIG. 6 is a sectional view taken along line A-A' in FIG. 5. In FIGS. 5 and 6, the same component as in FIGS. 1 and 2 is denoted by the same reference numeral and the description on the component is omitted. Channel layer 102, first spacer layer 103, second spacer layer 104, first electronic barrier layer 105, and second electronic barrier layer 106 are sequentially grown on the main surface of substrate 101 made of Si. Then, gate recess 201 is created by dry etching after resist patterning. Then, ion implanted section 301 is formed by ion implantation after resist patterning. Then, again by the MOCVD method, third electronic barrier layer 202 and p-type layer 203 are formed. Then, p-type layer 203 except the portion at gate recess 201 and the portion between the gate and the source is removed by dry etching after resist patterning. Then, source electrode 302 and drain electrode 303 are formed on third electronic barrier layer 202. Then, gate electrode 304 is formed on p-type layer 203. Further, p-type layer 203 is formed so as to surround source electrode 302. Similarly to the first exemplary embodiment, the threshold of the device is determined by the thickness of regrown third electronic barrier layer 202, so that a field effect transistor having a preferable threshold property can be provided. In the third exemplary embodiment, regrown third electronic barrier layer 202 is depleted by p-type layer 203, so that ion implantation needs not to be performed on regrown third electronic barrier layer 202. The depletion layer formed by p-type layer 203 further suppresses current leakage through a surface compared to the first exemplary embodiment and the second exemplary embodiment.

According to the third exemplary embodiment as described above, a field effect transistor that operates under a high current and has a normally-off property, low current leakage, and high threshold controllability can be provided.

Fourth Exemplary Embodiment

Figure 7:
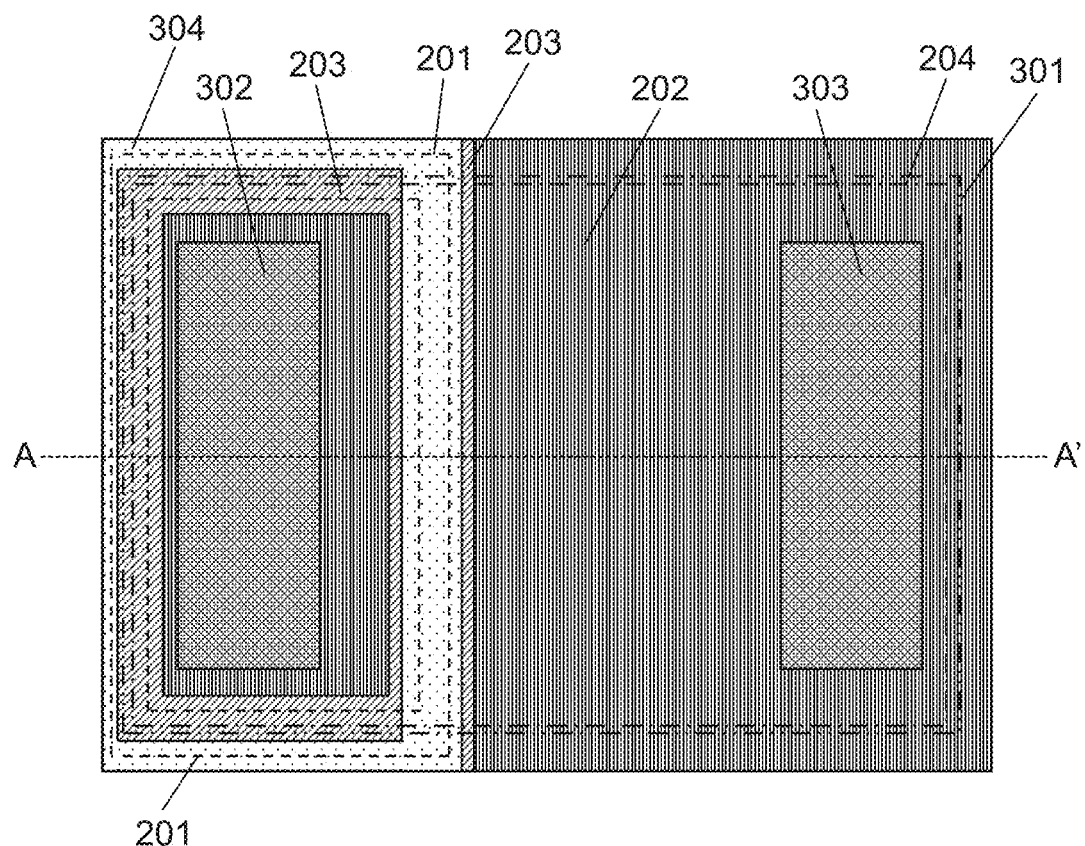
FIG. 7 is a top view of a field effect transistor according to a fourth exemplary embodiment.
Figure 8:
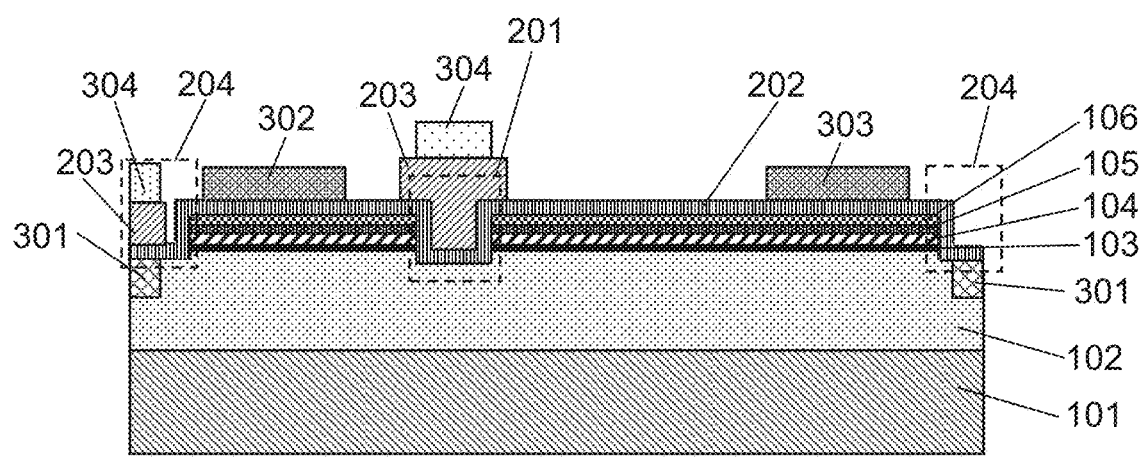
FIG. 8 is a sectional view of the field effect transistor according to the fourth exemplary embodiment.

A nitride semiconductor element according to a fourth exemplary embodiment and a method for manufacturing the nitride semiconductor element will now be described. FIG. 7 is a top view of the field effect transistor according to the fourth exemplary embodiment, and FIG. 8 is a sectional view taken along line A-A' in FIG. 7. In FIGS. 7 and 8, the same component as in FIGS. 1 and 2 is denoted by the same reference numeral and the description on the component is omitted. Channel layer 102, first spacer layer 103, second spacer layer 104, first electronic barrier layer 105, and second electronic barrier layer 106 are sequentially grown on the main surface of substrate 101 made of Si. Then, gate recess 201 is created by dry etching after resist patterning. Then, element isolating section 204 is created by dry etching after resist patterning. Then, ion implanted section 301 is formed by ion implantation after resist patterning. Then, again by the MOCVD method, third electronic barrier layer 202 and p-type layer 203 are formed. Then, p-type layer 203 except the portion at gate recess 201 and the portion between the gate and the source is removed by dry etching after resist patterning. Then, source electrode 302 and drain electrode 303 are formed on third electronic barrier layer 202. Then, gate electrode 304 is formed on p-type layer 203. Further, p-type layer 203 is formed so as to surround source electrode 302. Similarly to the first exemplary embodiment, the threshold of the device is determined by the thickness of regrown third electronic barrier layer 202, so that a field effect transistor having a preferable threshold property can be provided. Further, p-type layer 203 is formed so as to surround source electrode 302. In the fourth exemplary embodiment, regrown third electronic barrier layer 202 is depleted by p-type layer 203, so that ion implantation needs not to be performed on regrown third electronic barrier layer 202. Furthermore, since ions are not directly implanted in the channel, a stable element isolating property independent of the ion implantation profile is expected to be provided.

A stable element isolating property independent of the ion implantation profile is expected to be provided. The depletion layer formed by p-type layer 203 further suppresses current leakage through a surface compared to the first exemplary embodiment and the second exemplary embodiment.

According to the fourth exemplary embodiment as described above, a field effect transistor that operates under a high current and has a normally-off property, low current leakage, a stable element isolating property, and high threshold controllability can be provided.

Fifth Exemplary Embodiment

Figure 9:
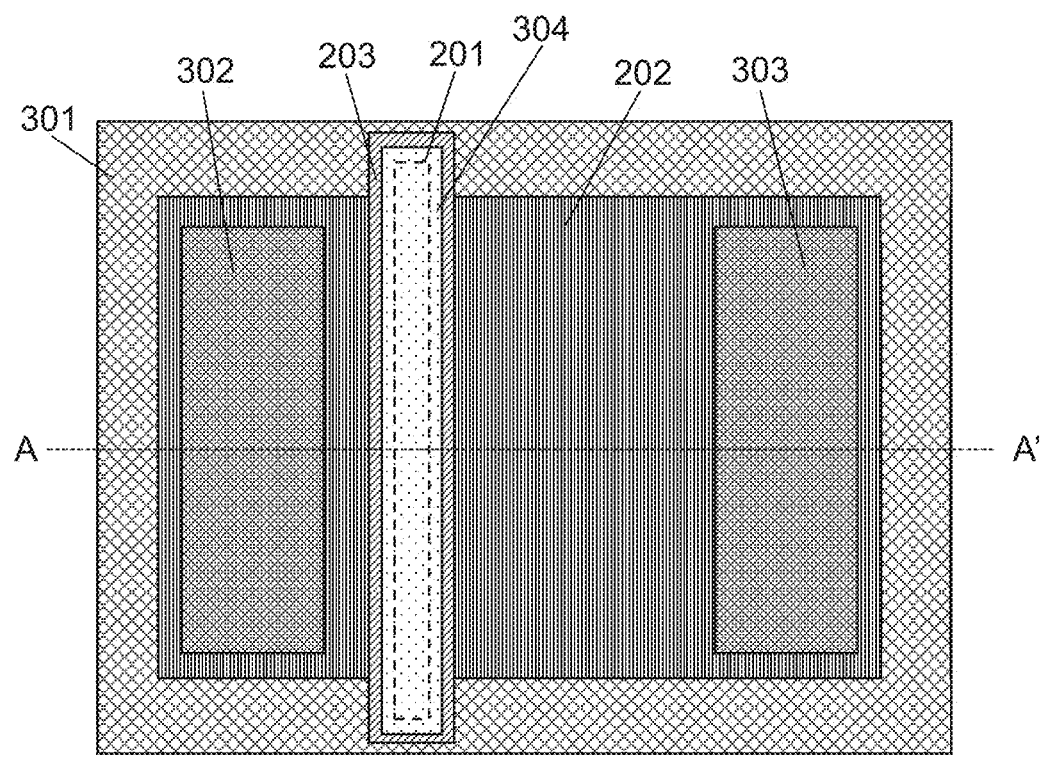
FIG. 9 is a top view of a field effect transistor according to a fifth exemplary embodiment.
Figure 10:
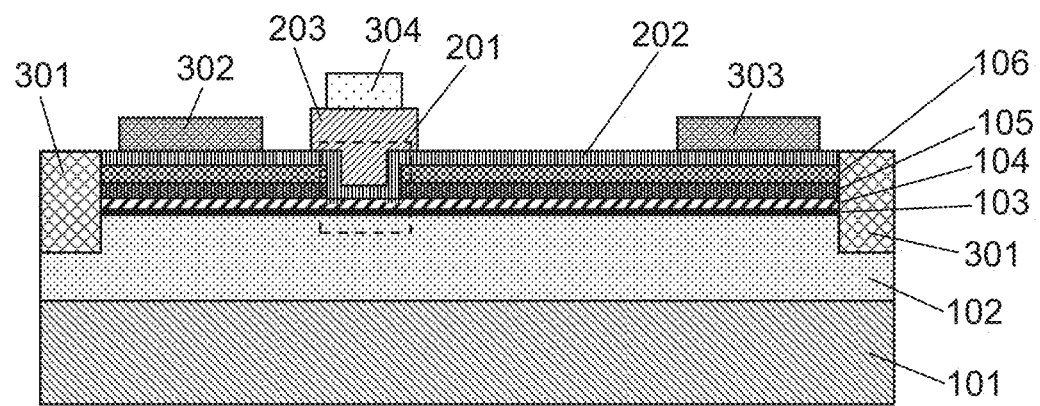
FIG. 10 is a sectional view of the field effect transistor according to the fifth exemplary embodiment.

A nitride semiconductor element according to a fifth exemplary embodiment and a method for manufacturing the nitride semiconductor element will now be described. FIG. 9 is a top view of the field effect transistor according to the fifth exemplary embodiment, and FIG. 10 is a sectional view taken along line A-A' in FIG. 9. In FIGS. 9 and 10, the same component as in FIGS. 1 and 2 is denoted by the same reference numeral and the description on the component is omitted. Channel layer 102, first spacer layer 103, second spacer layer 104, first electronic barrier layer 105, and second electronic barrier layer 106 are sequentially grown on the main surface of substrate 101 made of Si. Then, gate recess 201 is created by dry etching after resist patterning. The bottom face of gate recess 201 reaches first spacer layer 103 or second spacer layer 104. Then, ion implanted section 301 is formed by ion implantation after resist patterning. Then, again by the MOCVD method, third electronic barrier layer 202 and p-type layer 203 are formed. Then, ion implanted section 301 is formed again by ion implantation after resist patterning. Then, p-type layer 203 except the portion at gate recess 201 and the portion between the gate and the source is removed by dry etching after resist patterning. Then, source electrode 302 and drain electrode 303 are formed on third electronic barrier layer 202. Then, gate electrode 304 is formed on p-type layer 203.

According to the fifth exemplary embodiment as described above, a field effect transistor that operates under a high current and has a normally-off property can be provided.

Sixth Exemplary Embodiment

Figure 11:
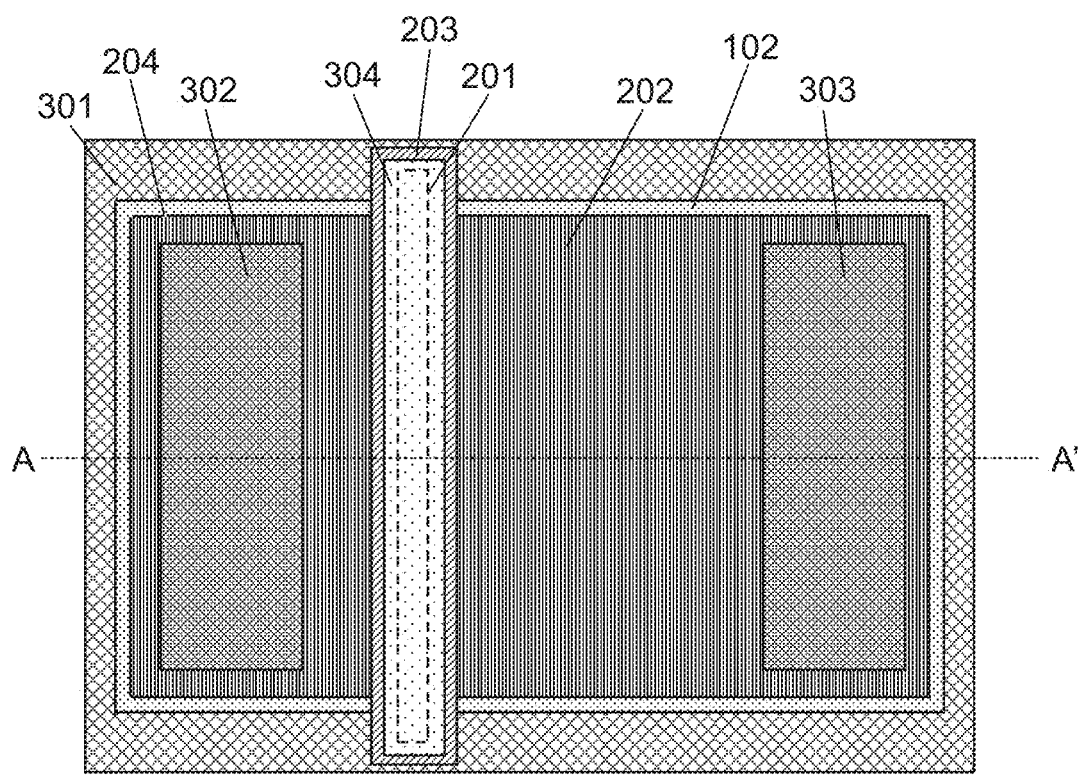
FIG. 11 is a top view of a field effect transistor according to a sixth exemplary embodiment.
Figure 12:
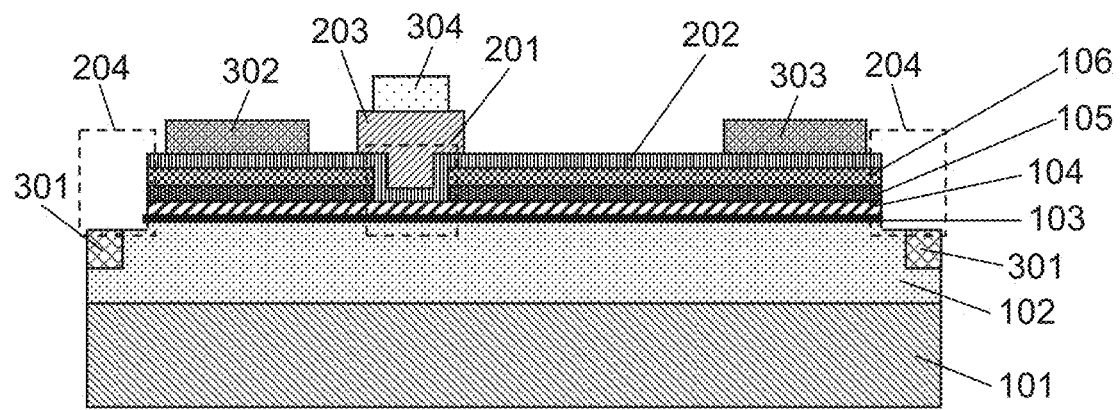
FIG. 12 is a sectional view of the field effect transistor according to the sixth exemplary embodiment.

A nitride semiconductor element according to a sixth exemplary embodiment and a method for manufacturing the nitride semiconductor element will now be described. FIG. 11 is a top view of the field effect transistor according to the sixth exemplary embodiment, and FIG. 12 is a sectional view taken along line A-A' in FIG. 11. In FIGS. 11 and 12, the same component as in FIGS. 1 and 2 is denoted by the same reference numeral and the description on the component is omitted. Channel layer 102, first spacer layer 103, second spacer layer 104, first electronic barrier layer 105, and second electronic barrier layer 106 are sequentially grown on the main surface of substrate 101 made of Si. Then, gate recess 201 is created by dry etching after resist patterning. Then, again by the MOCVD method, third electronic barrier layer 202 and p-type layer 203 are formed. Then, p-type layer 203 except the portion at gate recess 201 and the portion between the gate and the source is removed by dry etching after resist patterning. Then, element isolating section 204 is created by dry etching after resist patterning. Then, ion implanted section 301 is formed by ion implantation after resist patterning. Then, source electrode 302 and drain electrode 303 are formed on third electronic barrier layer 202. Then, gate electrode 304 is formed on p-type layer 203. Source electrode 302 is formed so as to be surrounded by p-type layer 203. Similarly to the second exemplary embodiment, ion implantation is required only once because regrown third electronic barrier layer 202 is removed by dry etching. Moreover, since ions are not directly implanted in the channel, a stable element isolating property independent of the ion implantation profile is expected to be provided.

According to the sixth exemplary embodiment as described above, a field effect transistor that operates under a high current and has a normally-off property and a stable element isolating property can be provided.

Seventh Exemplary Embodiment

Figure 13:
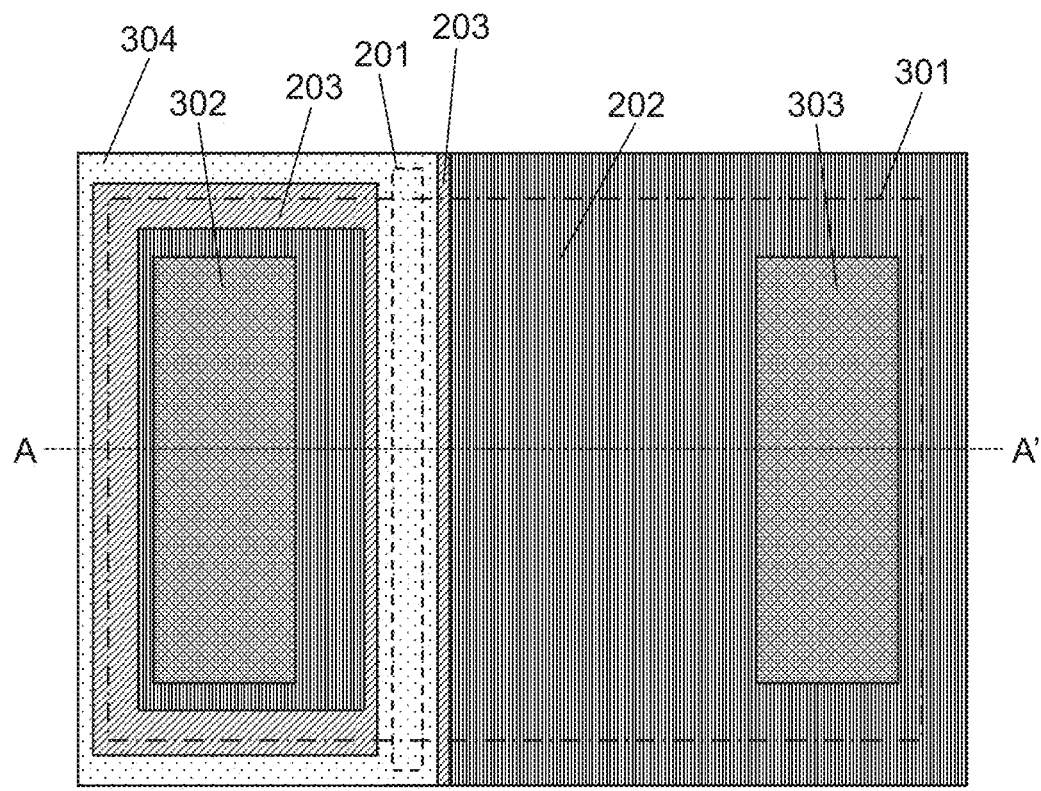
FIG. 13 is a top view of a field effect transistor according to a seventh exemplary embodiment.
Figure 14:
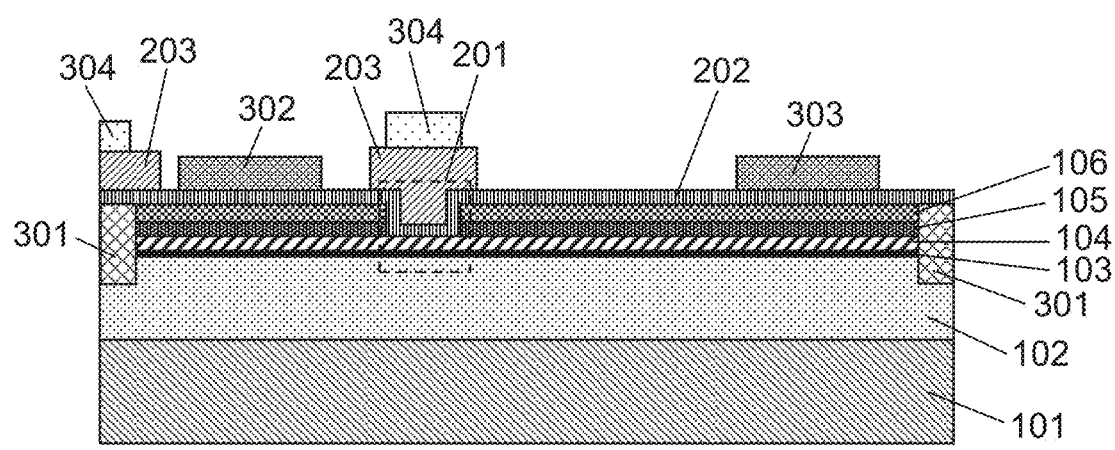
FIG. 14 is a sectional view of the field effect transistor according to the seventh exemplary embodiment.

A nitride semiconductor element according to a seventh exemplary embodiment and a method for manufacturing the nitride semiconductor element will now be described. FIG. 13 is a top view of the field effect transistor according to the seventh exemplary embodiment, and FIG. 14 is a sectional view taken along line A-A' in FIG. 13. In FIGS. 13 and 14, the same component as in FIGS. 1 and 2 is denoted by the same reference numeral and the description on the component is omitted. Channel layer 102, first spacer layer 103, second spacer layer 104, first electronic barrier layer 105, and second electronic barrier layer 106 are sequentially grown on the main surface of substrate 101 made of Si. Then, gate recess 201 is created by dry etching after resist patterning. The bottom face of gate recess 201 reaches first spacer layer 103 or the second spacer layer 104. Then, ion implanted section 301 is formed by ion implantation after resist patterning. Then, again by the MOCVD method, third electronic barrier layer 202 and p-type layer 203 are formed. Then, p-type layer 203 except the portion at gate recess 201 and the portion between the gate and the source is removed by dry etching after resist patterning. Then, source electrode 302 and drain electrode 303 are formed on third electronic barrier layer 202. Then, gate electrode 304 is formed on p-type layer 203. Further, p-type layer 203 is formed so as to surround source electrode 302. Similarly to the third exemplary embodiment, regrown third electronic barrier layer 202 is depleted by p-type layer 203, so that ion implantation needs not to be performed on regrown third electronic barrier layer 202. The depletion layer formed by p-type layer 203 further suppresses current leakage through a surface compared to the fifth exemplary embodiment and the sixth exemplary embodiment.

According to the seventh exemplary embodiment as described above, a field effect transistor that operates under a high current and has a normally-off property and low current leakage can be provided.

Eighth Exemplary Embodiment

Figure 15:
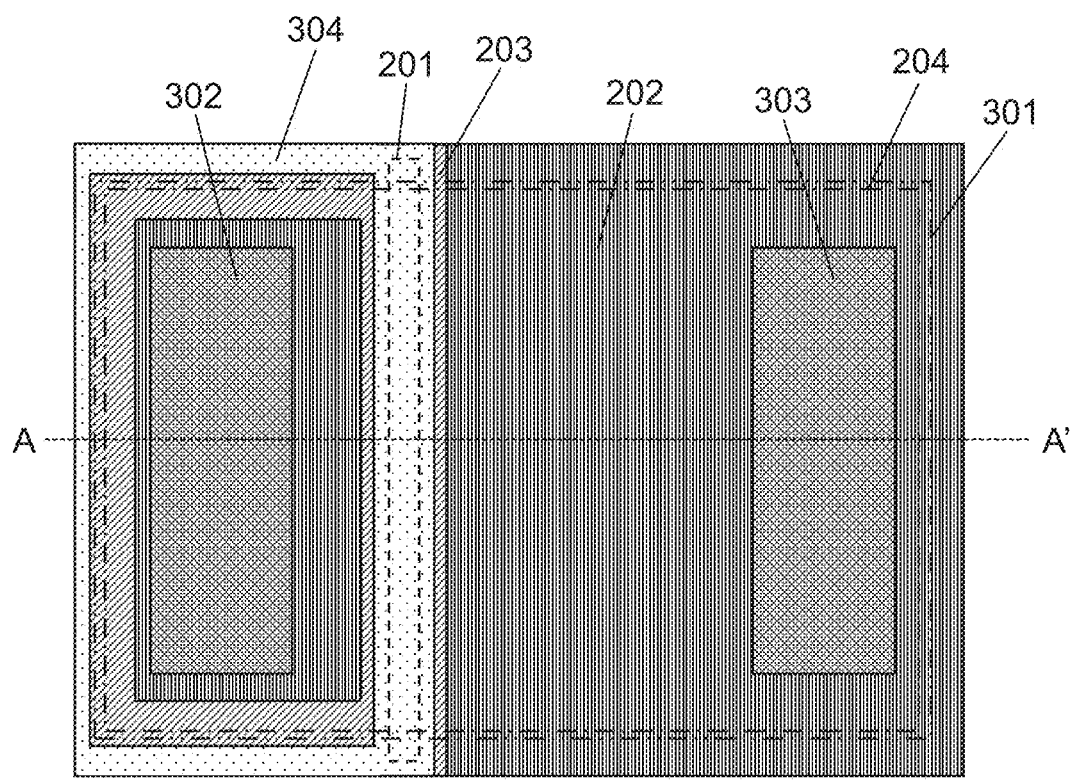
FIG. 15 is a top view of a field effect transistor according to an eighth exemplary embodiment.
Figure 16:
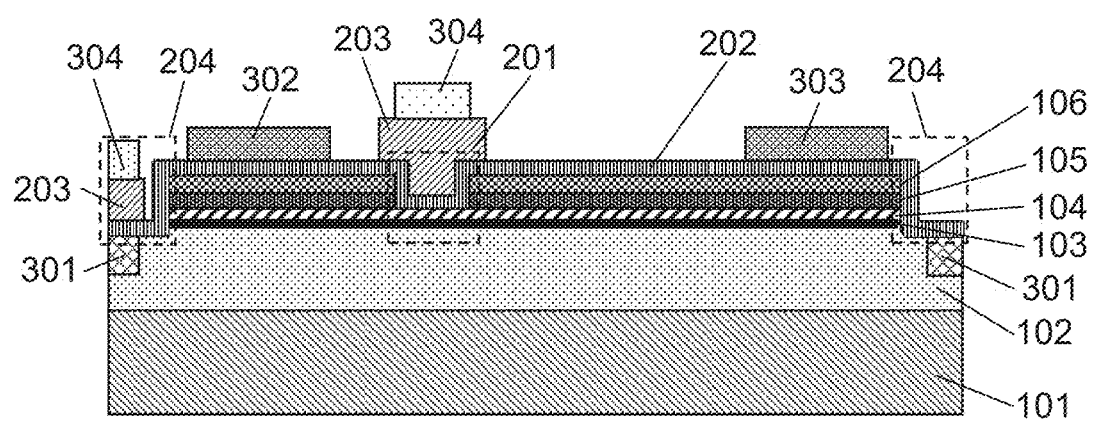
FIG. 16 is a sectional view of the field effect transistor according to the eight exemplary embodiment.

A nitride semiconductor element according to an eighth exemplary embodiment and a method for manufacturing the nitride semiconductor element will now be described. FIG. 15 is a top view of the field effect transistor according to the eighth exemplary embodiment, and FIG. 16 is a sectional view taken along line A-A' in FIG. 15. In FIGS. 15 and 16, the same component as in FIGS. 1 and 2 is denoted by the same reference numeral and the description on the component is omitted. Channel layer 102, first spacer layer 103, second spacer layer 104, first electronic barrier layer 105, and second electronic barrier layer 106 are sequentially grown on the main surface of substrate 101 made of Si. Then, gate recess 201 is created by dry etching after resist patterning. The bottom face of gate recess 201 reaches first spacer layer 103 or second spacer layer 104. Then, element isolating section 204 is created by dry etching after resist patterning. Then, ion implanted section 301 is formed by ion implantation after resist patterning. Then, again by the MOCVD method, p-type layer 203 is formed. Then, p-type layer 203 except the portion at gate recess 201 and the portion between the gate and the source is removed by dry etching after resist patterning. Then, source electrode 302 and drain electrode 303 are formed on second electronic barrier layer 106. Then, gate electrode 304 is formed on p-type layer 203. Further, p-type layer 203 is formed so as to surround source electrode 302. Similarly to the fourth exemplary embodiment, regrown third electronic, barrier layer 202 is depleted by p-type layer 203, so that ion implantation needs not to be performed on regrown third electronic barrier layer 202. Furthermore, since ions are not directly implanted in the channel, a stable element isolating property independent of the ion implantation profile is expected to be provided. The depletion layer formed by p-type layer 203 further suppresses current leakage through a surface compared to the fifth exemplary embodiment and the sixth exemplary embodiment.

According to the eighth exemplary embodiment as described above, a field effect transistor that operates under a high current and has a normally-off property, low current leakage, and a stable element isolating property can be provided.

Ninth Exemplary Embodiment

Figure 17:
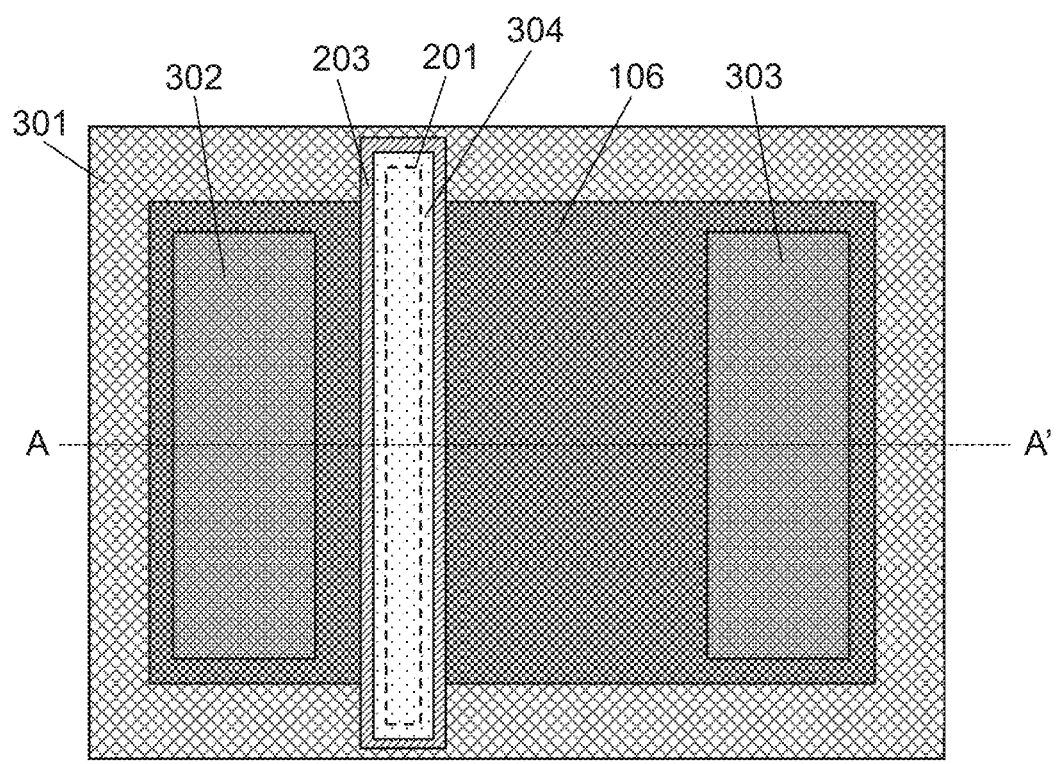
FIG. 17 is a top view of a field effect transistor according to a ninth exemplary embodiment.
Figure 18:
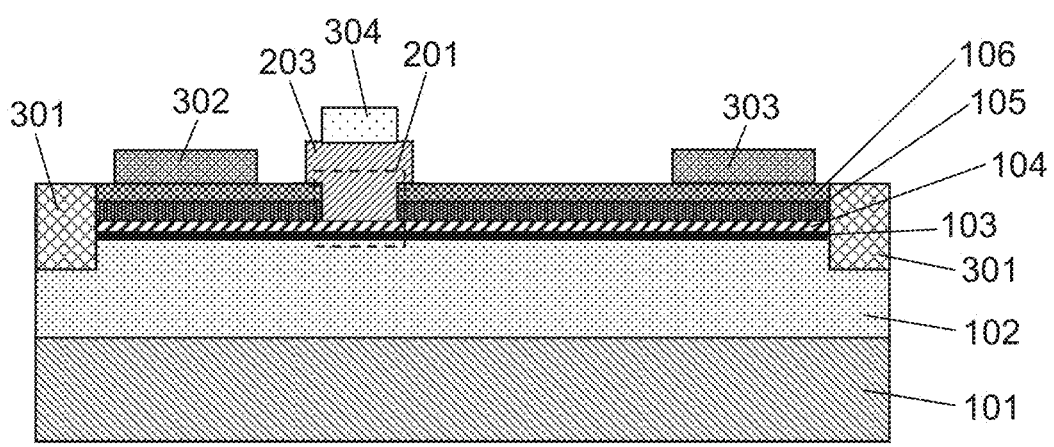
FIG. 18 is a sectional view of the field effect transistor according to the ninth exemplary embodiment.

A nitride semiconductor element according to a ninth exemplary embodiment and a method for manufacturing the nitride semiconductor element will now be described. FIG. 17 is a top view of the field effect transistor according to the ninth exemplary embodiment, and FIG. 18 is a sectional view taken along line A-A' in FIG. 17. In FIGS. 17 and 18, the same component as in FIGS. 1 and 2 is denoted by the same reference numeral and the description on the component is omitted. Channel layer 102, first spacer layer 103, second spacer layer 104, first electronic barrier layer 105, and second electronic barrier layer 106 are sequentially grown on the main surface of substrate 101 made of Si. Then, gate recess 201 is created by dry etching after resist patterning. The bottom face of gate recess 201 reaches first spacer layer 103 or second spacer layer 104. Then, ion implanted section 301 is formed by ion implantation after resist patterning. Then, again by the MOCVD method, p-type layer 203 is formed. Then, ion implanted section 301 is formed again by ion implantation after resist patterning. Then, p-type layer 203 except the portion at gate recess 201 and the portion between the gate and the source is removed by dry etching after resist patterning. Then, source electrode 302 and drain electrode 303 are formed on second electronic barrier layer 106. Then, gate electrode 304 is formed on p-type layer 203.

According to the ninth exemplary embodiment as described above, a field effect transistor that operates under a high current and has a normally-off property can be provided.

Tenth Exemplary Embodiment

Figure 19:
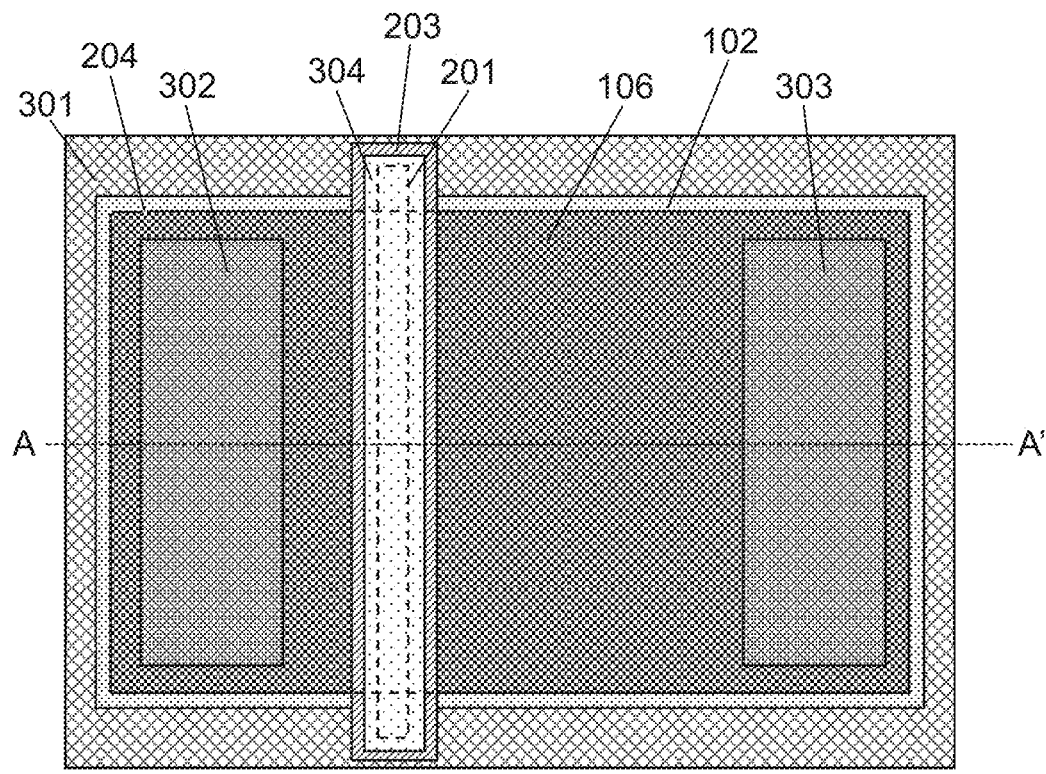
FIG. 19 is a top view of a field effect transistor according to a tenth exemplary embodiment.
Figure 20:
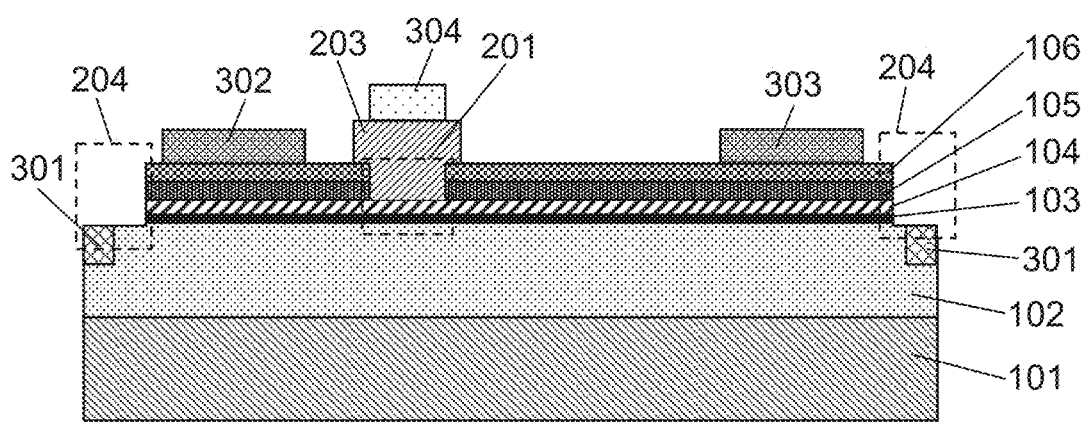
FIG. 20 is a sectional view of the field effect transistor according to the tenth exemplary embodiment.

A nitride semiconductor element according to a tenth exemplary embodiment and a method for manufacturing the nitride semiconductor element will now be described. FIG. 19 is a top view of the field effect transistor according to the tenth exemplary embodiment, and FIG. 20 is a sectional view taken along line A-A' in FIG. 19. In FIGS. 19 and 20, the same component as in FIGS. 1 and 2 is denoted by the same reference numeral and the description on the component is omitted. Channel layer 102, first spacer layer 103, second spacer layer 104, first electronic barrier layer 105, and second electronic barrier layer 106 are sequentially grown on the main surface of substrate 101 made of Si. Then, gate recess 201 is created by dry etching after resist patterning. Then, again by the MOCVD method, p-type layer 203 is formed. Then, p-type layer 203 except the portion at gate recess 201 and the portion between the gate and the source is removed by dry etching after resist patterning. Then, element isolating section 204 is created by dry etching after resist patterning. Then, ion implanted section 301 is formed by ion implantation after resist patterning. Then, source electrode 302 and drain electrode 303 are formed on second electronic barrier layer 106. Then, gate electrode 304 is formed on the p-type layer 203. Source electrode 302 is formed so as to be surrounded by p-type layer 203. Similarly to the second exemplary embodiment, since ions are not directly implanted in the channel, a stable element isolating property independent of the ion implantation profile is expected to be provided.

According to the tenth exemplary embodiment as described above, a field effect transistor that operates under a high current and has a normally-off property and a stable element isolating property can be provided.

Eleventh Exemplary Embodiment

Figure 21:
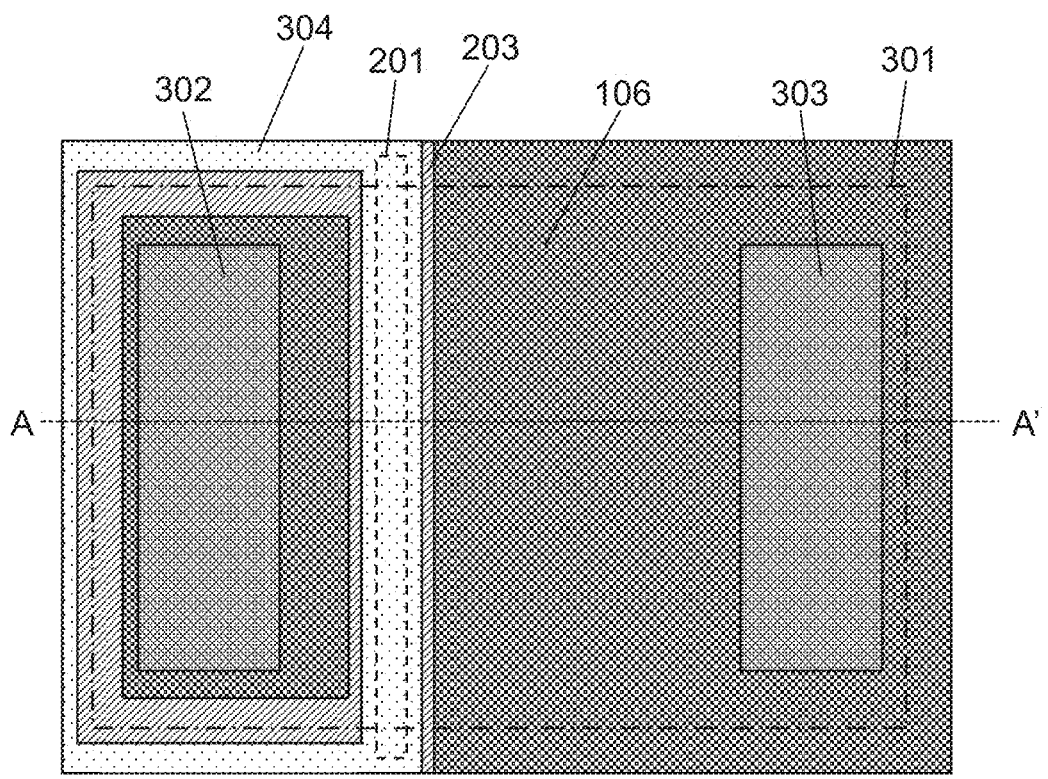
FIG. 21 is a top view of a field effect transistor according to an eleventh exemplary embodiment.
Figure 22:
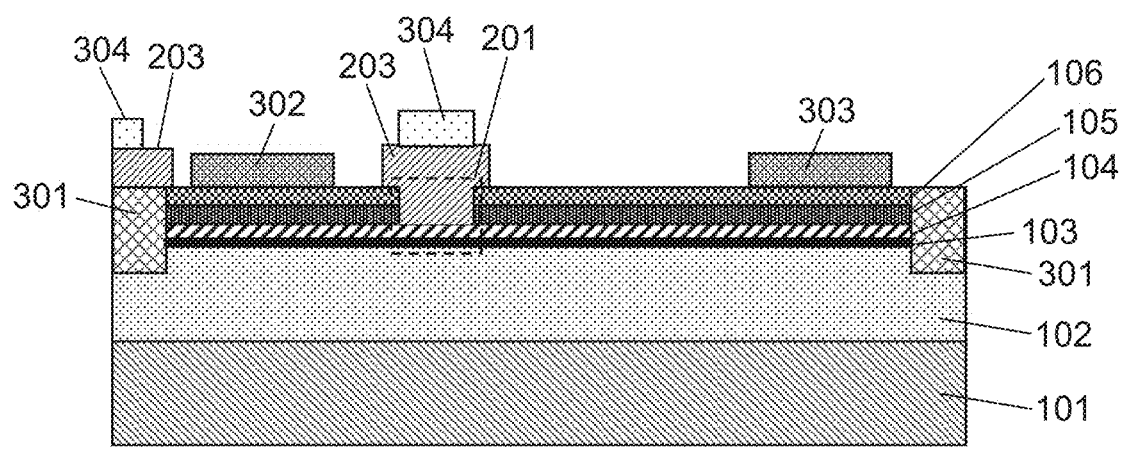
FIG. 22 is a sectional view of the field effect transistor according to the eleventh exemplary embodiment.

A nitride semiconductor element according to an eleventh exemplary embodiment and a method for manufacturing the nitride semiconductor element will now be described. FIG. 21 is a top view of the field effect transistor according to the eleventh exemplary embodiment, and FIG. 22 is a sectional view taken along line A-A' in FIG. 21. In FIGS. 21 and 22, the same component as in FIGS. 1 and 2 is denoted by the same reference numeral and the description on the component is omitted. Channel layer 102, first spacer layer 103, second spacer layer 104, first electronic barrier layer 105, and second electronic barrier layer 106 are sequentially grown on the main surface of substrate 101 made of Si. Then, gate recess 201 is created by dry etching after resist patterning. The bottom face of gate recess 201 reaches first spacer layer 103 or second spacer layer 104. Then, ion implanted section 301 is formed by ion implantation after resist patterning. Then, again by the MOCVD method, p-type layer 203 is formed. Then, p-type layer 203 except the portion at gate recess 201 and the portion between the gate and the source is removed by dry etching after resist patterning. Then, source electrode 302 and drain electrode 303 are formed on second electronic barrier layer 106. Then, gate electrode 304 is formed on p-type layer 203. Further, p-type layer 203 is formed so as to surround source electrode 302. Similarly to the third exemplary embodiment, the depletion layer formed by p-type layer 203 further suppresses current leakage through a surface compared to the ninth exemplary embodiment and the tenth exemplary embodiment.

According to the eleventh exemplary embodiment as described above, a field effect transistor that operates under a high current and has a normally-off property and low current leakage can be provided.

Twelfth Exemplary Embodiment

Figure 23:
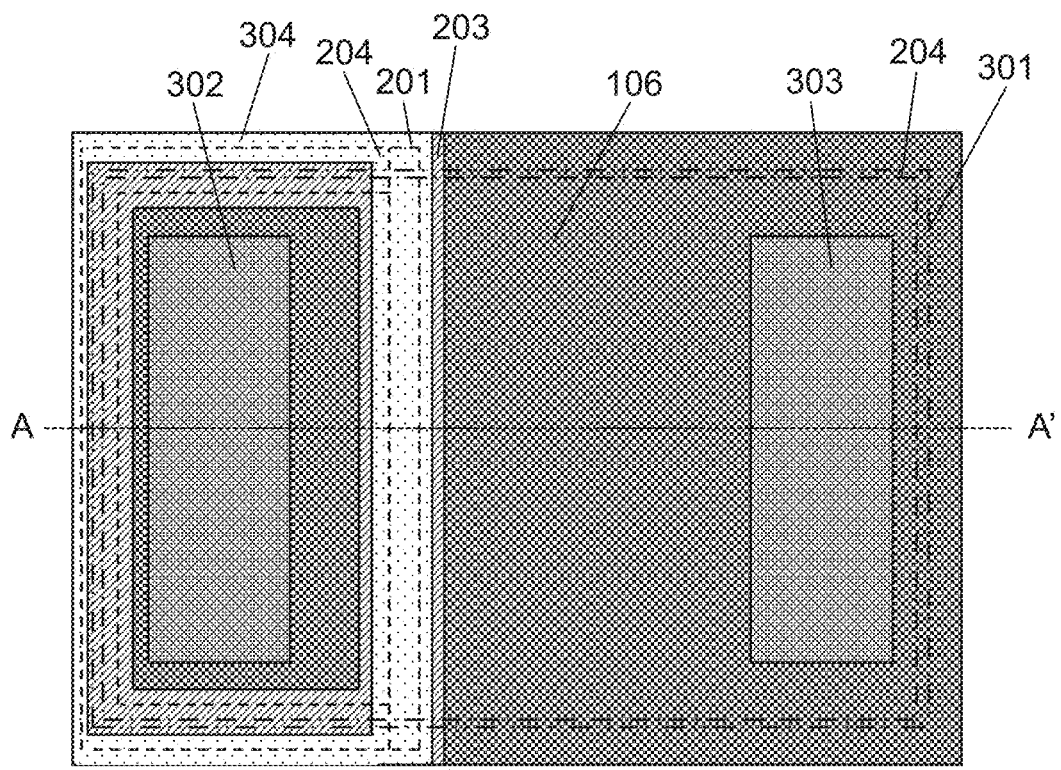
FIG. 23 is a top view of a field effect transistor according to a twelfth exemplary embodiment.
Figure 24:
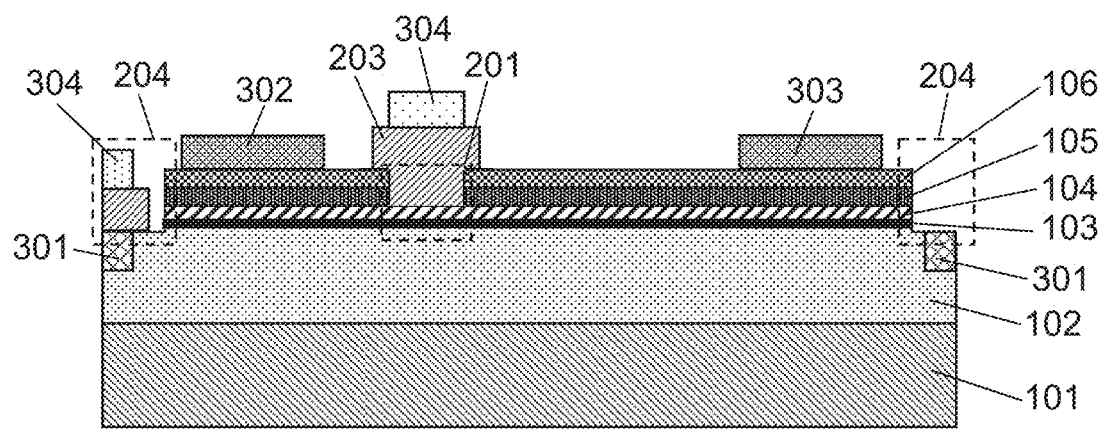
FIG. 24 is a sectional view of the field effect transistor according to the twelfth exemplary embodiment.

A nitride semiconductor element according to a twelfth exemplary embodiment and a method for manufacturing the nitride semiconductor element will now be described. FIG. 23 is a top view of the field effect transistor according to the twelfth exemplary embodiment, and FIG. 24 is a sectional view taken along line A-A' in FIG. 23. In FIGS. 23 and 24, the same component as in FIGS. 1 and 2 is denoted by the same reference numeral and the description on the component is omitted. Channel layer 102, first spacer layer 103, second spacer layer 104, first electronic barrier layer 105, and second electronic barrier layer 106 are sequentially grown on the main surface of substrate 101 made of Si. Then, gate recess 201 is created by dry etching after resist patterning. The bottom face of gate recess 201 reaches first spacer layer 103 or second spacer layer 104. Then, element isolating section 204 is created by dry etching after resist patterning. Then, ion implanted section 301 is formed by ion implantation after resist patterning. Then, again by the MOCVD method, p-type layer 203 is formed. Then, p-type layer 203 except the portion at gate recess 201 and the portion between the gate and the source is removed by dry etching after resist patterning. Then, source electrode 302 and drain electrode 303 are formed on second electronic barrier layer 106. Then, gate electrode 304 is formed on p-type layer 203. Further, p-type layer 203 is formed so as to surround source electrode 302. Similarly to the fourth exemplary embodiment, the depletion layer formed by p-type layer 203 further suppresses current leakage through a surface compared to the ninth exemplary embodiment and the tenth exemplary embodiment.

According to the twelfth exemplary embodiment as described above, a field effect transistor that operates under a high current and has a normally-off property, low current leakage, and a stable element isolating property can be provided.

Thirteenth Exemplary Embodiment

Figure 25:
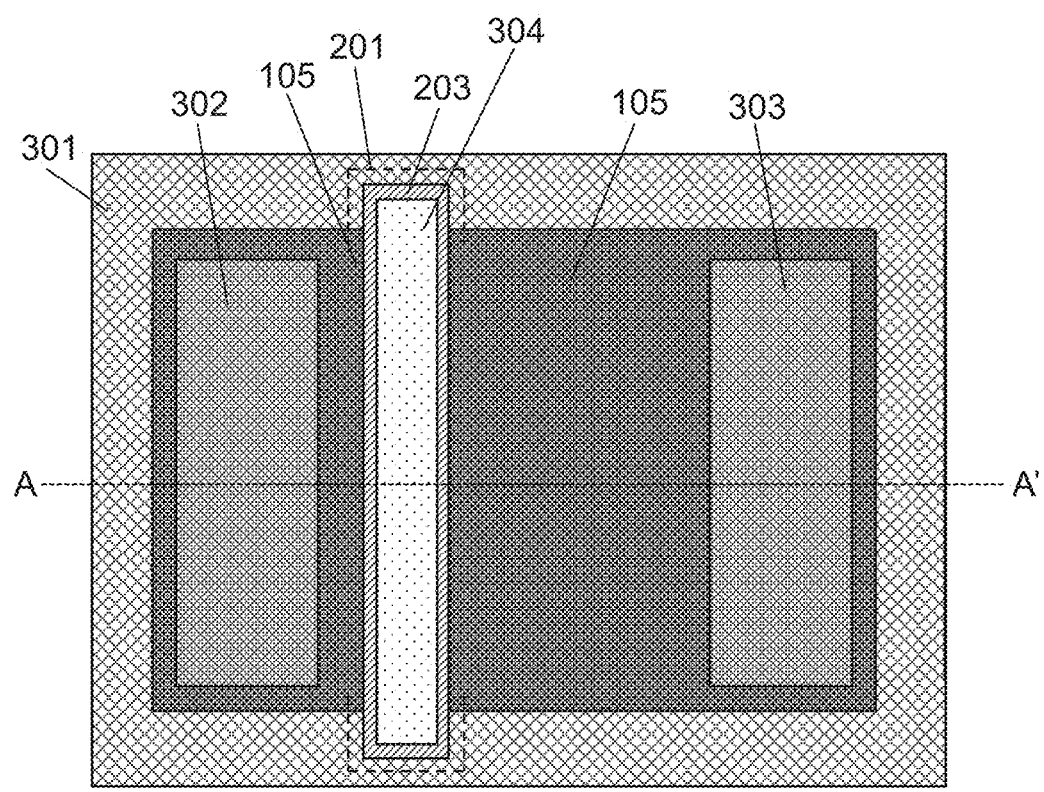
FIG. 25 is a top view of a field effect transistor according to a thirteenth exemplary embodiment.
Figure 26:
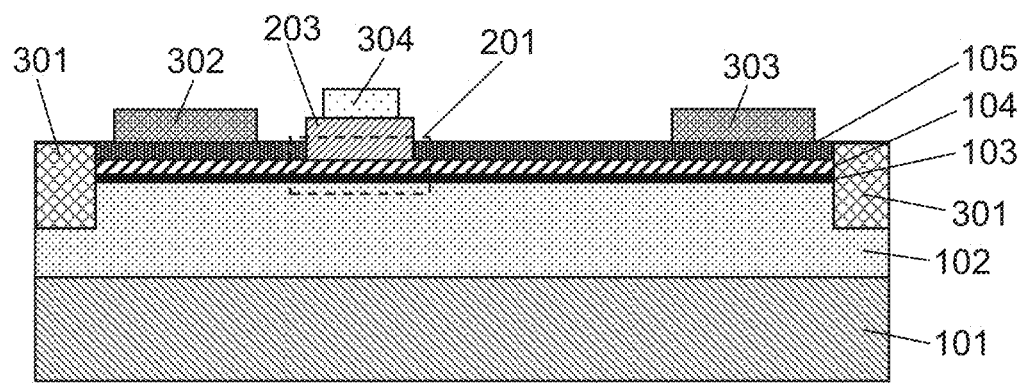
FIG. 26 is a sectional view of the field effect transistor according to the thirteenth exemplary embodiment.

A nitride semiconductor element according to a thirteenth exemplary embodiment and a method for manufacturing the nitride semiconductor element will now be described. FIG. 25 is a top view of the field effect transistor according to the thirteenth exemplary embodiment, and FIG. 26 is a sectional view taken along line A-A' in FIG. 25. In FIGS. 25 and 26, the same component as in FIGS. 1 and 2 is denoted by the same reference numeral and the description on the component is omitted. Channel layer 102, first spacer layer 103, second spacer layer 104, and p-type layer 203 are sequentially grown on the main surface of substrate 101 made of Si. Then, an insulating film made of, for example, $SiO_2$ is formed on p-type layer 203. Then, the insulating film and p-type layer 203 except the portion at gate recess 201 are removed by dry etching after resist patterning. Then, again by the MOCVD method, first electronic barrier layer 105 is formed. Since the insulating film is formed on p-type layer 203, first electronic barrier layer 105 is not formed on p-type layer 203. Then, the insulating film is removed using hydrofluoric acid. Then, ion implanted section 301 is formed by ion implantation after resist patterning. Then, source electrode 302 and drain electrode 303 are formed on first electronic barrier layer 105. Then, gate electrode 304 is formed on p-type layer 203. Source electrode 302 is formed so as to be surrounded by p-type layer 203.

According to the thirteenth exemplary embodiment as described above, a field effect transistor that operates under a high current and has a normally-off property can be provided.

Fourteenth Exemplary Embodiment

Figure 27:
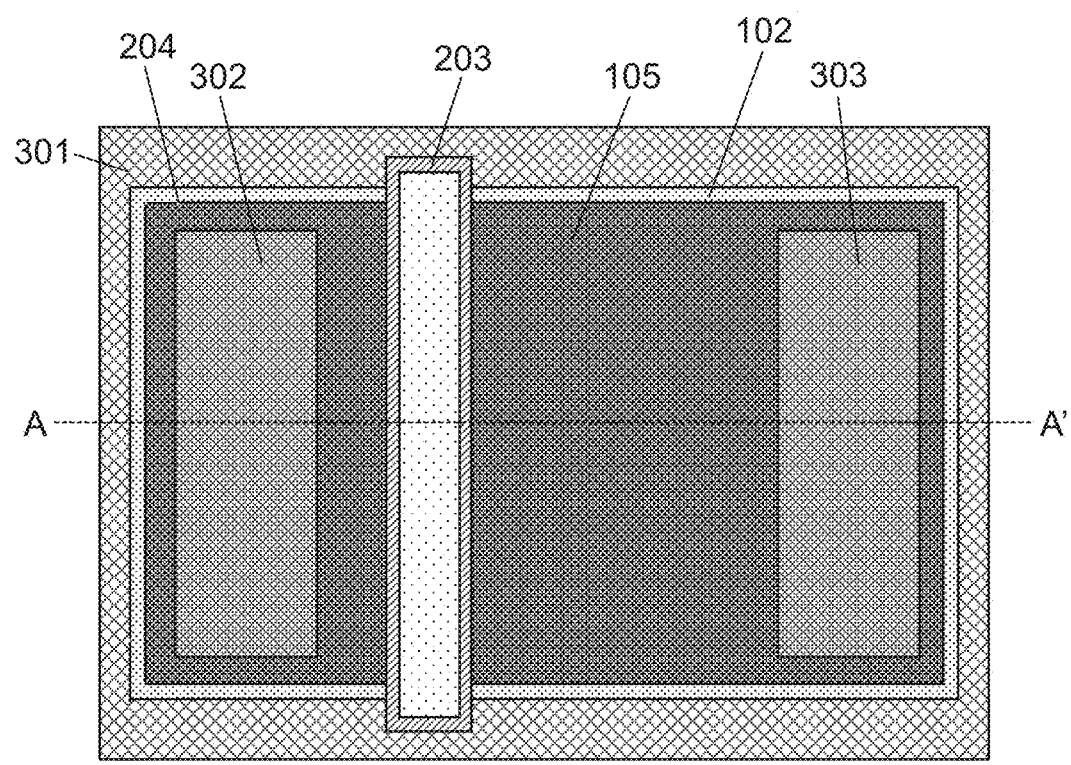
FIG. 27 is a top view of a field effect transistor according to a fourteenth exemplary embodiment.
Figure 28:
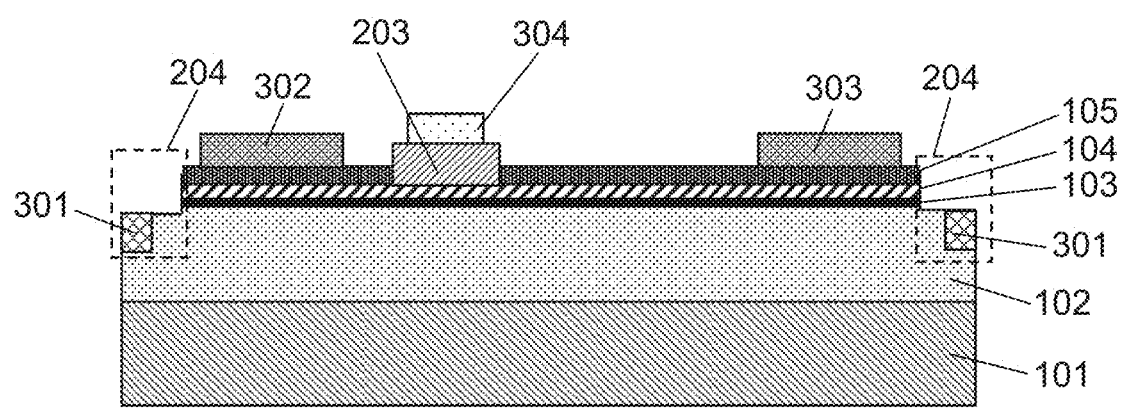
FIG. 28 is a sectional view of the field effect transistor according to the fourteenth exemplary embodiment.

A nitride semiconductor element according to a fourteenth exemplary embodiment and a method for manufacturing the nitride semiconductor element will now be described. FIG. 27 is a top view of the field effect transistor according to the fourteenth exemplary embodiment, and FIG. 28 is a sectional view taken along line A-A' in FIG. 27. In FIGS. 27 and 28, the same component as in FIGS. 1 and 2 is denoted by the same reference numeral and the description on the component is omitted. Channel layer 102, first spacer layer 103, second spacer layer 104, and p-type layer 203 are sequentially grown on the main surface of substrate 101 made of Si. Then, an insulating film made of for example, $SiO_2$ is formed on p-type layer 203. Then, the insulating film and p-type layer 203 except the portion at gate recess 201 are removed by dry etching after resist patterning. Then, again by the MOCVD method, first electronic barrier layer 105 is formed. Since the insulating film is formed on p-type layer 203, first electronic barrier layer 105 is not formed on p-type layer 203. Then, the insulating film is removed using hydrofluoric acid. Then, element isolating section 204 is created by dry etching after resist patterning. Then, ion implanted section 301 is formed by ion implantation after resist patterning. Then, source electrode 302 and drain electrode 303 are formed on first electronic barrier layer 105. Then, gate electrode 304 is formed on p-type layer 203.

According to the fourteenth exemplary embodiment as described above, a field effect transistor that operates under a high current and has a normally-off property can be provided.

In the first to fourteenth exemplary embodiments, the composition and the thickness of each semiconductor layer constituting the field effect transistor and the width of gate recess 201 are not limited to those described above. Electrode-constituting metals and thicknesses of source electrode 302, drain electrode 303, and gate electrode 304 are not limited to those of the exemplary embodiments. The region of ion implanted section 301 is not limited to those of the exemplary embodiments.

The carrier concentration of p-type layer 203 of the first to fourteenth exemplary embodiments is not limited to those described above.

Other than Si having a (111) plane as the main surface, a material such as sapphire, silicon carbide, gallium nitride, aluminum nitride, and gallium oxide can be used as substrate 101 of the first to fourteenth exemplary embodiments.

Although Mg is used as an impurity serving as an acceptor in the first to fourteenth exemplary embodiments, Be, C, or Zn may be used other than Mg.

In a field effect transistor according to the present disclosure, the electronic barrier layer made of a nitride semiconductor including in is doped with Mg to reduce current leakage at the gate and to improve off-voltage tolerance. The field effect transistor can largely be used in the fields of power devices where a high voltage tolerance is required, such as controlling of air conditioners and automobiles.

What is claimed is:

1. A field effect transistor comprising:
   a substrate;
   a first nitride semiconductor layer disposed on the substrate and including a channel region;
   a second nitride semiconductor layer disposed on the first nitride semiconductor layer and having a bandgap larger than a bandgap of the first nitride semiconductor layer;
   a third nitride semiconductor layer disposed on the second nitride semiconductor layer and having a bandgap smaller than the bandgap of the second nitride semiconductor layer;
   a fourth nitride semiconductor layer disposed on the third nitride semiconductor layer and including In;
   a first recess penetrating at least the fourth nitride semiconductor layer;
   a fifth nitride semiconductor layer of a p-type and provided at the first recess;
   a source electrode and a drain electrode disposed on the fourth nitride semiconductor layer;
   a gate electrode disposed on the fifth nitride semiconductor layer, and
   an element isolating section that completely surrounds the source electrode and the drain electrode in plan view,
   wherein the fifth nitride semiconductor layer completely surrounds the source electrode in a plan view,
   the fifth nitride semiconductor layer and the gate electrode overlap the element isolating section in the thickness direction of the substrate in a cross-sectional view which includes the gate electrode, the source electrode and the drain electrode, and
   the source electrode and the drain electrode do not overlap the element isolating section in the thickness direction of the substrate in a cross-sectional view which includes the gate electrode, the source electrode and the drain electrode.

2. The field effect transistor according to claim 1, further comprising:
   a sixth nitride semiconductor layer disposed on the fourth nitride semiconductor layer;
   wherein the sixth nitride semiconductor layer has a bandgap smaller than a bandgap of the fourth nitride semiconductor layer, and
   the first recess penetrates the sixth nitride semiconductor layer.

3. The field effect transistor according to claim 2, further comprising:
   a seventh nitride semiconductor layer disposed on the sixth nitride semiconductor layer to cover a side face and a bottom face of the recess,
   wherein the seventh nitride semiconductor layer has a bandgap larger than the bandgap of the sixth nitride semiconductor layer.

4. The field effect transistor according to claim 3,
   wherein the first recess penetrates the second nitride semiconductor layer and the third nitride semiconductor layer, and
   a bottom face of the seventh nitride semiconductor layer is in contact with the first nitride semiconductor layer.

5. The field effect transistor according to claim 1, wherein the element isolating section is formed by implantation of an impurity in at least a portion of the first nitride semiconductor layer.

6. The field effect transistor according to claim 5, further comprising
   a second recess surrounding in a plan view the gate electrode, the source electrode, and the drain electrode,
   wherein the element isolating section is provided in the second recess.

7. The field effect transistor according to claim 1, wherein the bandgap of the second nitride semiconductor layer is larger than the bandgap of the fourth nitride semiconductor layer.

8. The field effect transistor according to claim 1, wherein the element isolating section isolates the field effect transistor from another field effect transistor.

9. The field effect transistor according to claim 1, wherein the gate electrode includes a first part and a second part, the first part overlapping the element isolating section in the thickness direction of the substrate, the second part not overlapping the element isolating section in the thickness direction of the substrate.

10. The field effect transistor according to claim 9, wherein the second part of the gate electrode is disposed between the source electrode and the drain electrode in plan view.

11. The field effect transistor according to claim 9, wherein, when viewed in plan, a portion of the first part of the gate electrode, which extends parallel to a longitudinal axis of the source electrode, is disposed at a first side of the source electrode which is opposite to a second side of the source electrode facing the drain electrode.

12. The field effect transistor according to claim 3, wherein an edge of the seventh nitride semiconductor layer completely surrounds the source electrode and the drain electrode in plan view.

* * * * *